(12) United States Patent
Jung et al.

(10) Patent No.: US 11,270,607 B2
(45) Date of Patent: Mar. 8, 2022

(54) STRETCHABLE DISPLAY DEVICE

(71) Applicant: LG Display Co., Ltd., Seoul (KR)

(72) Inventors: Hyunju Jung, Seoul (KR); Seulki Kim, Seosan-si (KR)

(73) Assignee: LG Display Co., Ltd., Seoul (KR)

( * ) Notice: Subject to any disclaimer, the term of this patent is extended or adjusted under 35 U.S.C. 154(b) by 4 days.

(21) Appl. No.: 17/019,050

(22) Filed: Sep. 11, 2020

(65) Prior Publication Data

US 2021/0134191 A1  May 6, 2021

(30) Foreign Application Priority Data

Nov. 5, 2019 (KR) .................. 10-2019-0140336

(51) Int. Cl.
| | |
|---|---|
| G06F 3/041 | (2006.01) |
| G09F 9/30 | (2006.01) |
| H01L 33/62 | (2010.01) |
| H01L 27/15 | (2006.01) |
| G06F 3/044 | (2006.01) |

(52) U.S. Cl.
CPC .............. G09F 9/301 (2013.01); G06F 3/044 (2013.01); G06F 3/0412 (2013.01); H01L 27/156 (2013.01); H01L 33/62 (2013.01); *G06F 2203/04102* (2013.01); *G06F 2203/04111* (2013.01)

(58) Field of Classification Search
CPC ........ G09F 9/301; G06F 1/1652; G06F 3/041; G06F 3/0412; G06F 3/044; G06F 3/0445; G06F 3/0446; G06F 2203/04102; G06F 2203/04103; G06F 2203/04111; G06F 2203/04112; H01L 25/0753; H01L 25/167; H01L 27/156; H01L 27/3276; H01L 33/62
See application file for complete search history.

(56) References Cited

U.S. PATENT DOCUMENTS

| | | | | |
|---|---|---|---|---|
| 8,933,625 | B2 * | 1/2015 | Chung ................ | H01L 51/5271 313/506 |
| 9,853,246 | B2 * | 12/2017 | Kwon .................. | H01L 51/0097 |
| 10,943,893 | B2 * | 3/2021 | Jung ................... | H01L 51/0097 |
| 10,964,234 | B2 * | 3/2021 | Kim ...................... | G06F 1/1626 |
| 11,011,599 | B2 * | 5/2021 | Kim .................... | H01L 51/5281 |
| 11,049,926 | B2 * | 6/2021 | Jung .................. | H01L 51/5212 |
| 11,056,472 | B2 * | 7/2021 | Kim ...................... | H01L 27/124 |
| 11,108,004 | B2 * | 8/2021 | Kim .................... | H01L 27/3253 |

(Continued)

FOREIGN PATENT DOCUMENTS

| | | | | |
|---|---|---|---|---|
| KR | 10-2019-0048959 A | | 5/2019 | |
| KR | 20210032618 A | * | 3/2021 | ............. H01L 33/38 |

*Primary Examiner* — Joe H Cheng
(74) *Attorney, Agent, or Firm* — Seed IP Law Group LLP

(57) ABSTRACT

In one or more embodiments of the present disclosure, a stretchable display device includes a lower substrate which is stretchable, a lower common electrode layer disposed on the lower substrate, a plurality of first substrates disposed on the lower common electrode layer, at least one transistor formed on each of the plurality of first substrates, a light emitting diode which is electrically connected to the at least one transistor, a cover insulating layer which covers at least one light emitting diode, and an upper common electrode layer formed on the cover insulating layer. The stretchable display device according to the above embodiments thereby stably supplies a common voltage.

21 Claims, 9 Drawing Sheets

(56) References Cited

U.S. PATENT DOCUMENTS

| | | | |
|---|---|---|---|
| 2015/0311477 A1* | 10/2015 | Cho | H01L 27/3244 |
| | | | 257/40 |
| 2017/0005077 A1* | 1/2017 | Kim | G02B 6/0068 |
| 2017/0104182 A1* | 4/2017 | Kim | H01L 51/5271 |
| 2019/0109181 A1* | 4/2019 | Chung | H01L 51/0031 |
| 2020/0006684 A1* | 1/2020 | Liu | H01L 51/56 |
| 2020/0051964 A1* | 2/2020 | Jung | H01L 25/162 |
| 2020/0144522 A1* | 5/2020 | Jung | H01L 51/5253 |
| 2021/0134772 A1* | 5/2021 | Jung | H01L 25/0753 |

* cited by examiner

STRETCHABLE DISPLAY DEVICE

CROSS-REFERENCE TO RELATED APPLICATIONS

This application claims the priority of Korean Patent Application No. 10-2019-0140336, filed Nov. 5, 2019, in the Korean Intellectual Property Office, the disclosure of which is incorporated herein by reference.

BACKGROUND

Technical Field

The present disclosure relates to a stretchable display device, and more particularly to a stretchable display device to which a common electrode layer is applied.

Description of the Related Art

As display devices which are used for a monitor of a computer, a television, or a cellular phone, there are an organic light emitting display device (OLED) which is a self-emitting device and a liquid crystal display device (LCD) which requires a separate light source.

An applicable range of the display device is diversified to personal digital assistants as well as monitors of computers and televisions and a display device with a large display area and a reduced volume and weight is being studied.

Further, recently, a stretchable display device which is manufactured by forming a display unit and a wiring line on a flexible substrate such as plastic which is a flexible material so as to be stretchable in a specific direction and changed in various forms is getting attention as a next generation display device.

BRIEF SUMMARY

One or more embodiments of the present disclosure provides a stretchable display device which is capable of stably supplying a common voltage.

One or more embodiments of the present disclosure provides a stretchable display device which is capable of compensating for a pixel.

Further embodiments of the present disclosure provides a stretchable display device which is capable of sensing a touch.

Technical benefits of the present disclosure are not limited to the above-mentioned benefits, and other benefits, which are not mentioned above, can be clearly understood by those skilled in the art from the following descriptions.

According to an aspect of the present disclosure, a stretchable display device includes a lower substrate which is stretchable; a lower common electrode layer disposed on the lower substrate; a plurality of first substrates disposed on the lower common electrode layer; at least one transistor formed on each of the plurality of first substrates; a light emitting diode which is electrically connected to the at least one transistor; a cover insulating layer which covers at least one light emitting diode; and an upper common electrode layer formed on the cover insulating layer, thereby stably supplying a common voltage.

According to another aspect of the present disclosure, a stretchable display device includes a lower common electrode layer which is stretchable; a plurality of pixels disposed on the lower common electrode layer; a cover insulating layer which covers the plurality of pixels; and an upper common electrode layer which is formed on the cover insulating layer and is stretchable, in which the lower common electrode layer and the upper common electrode layer are electrically connected to the plurality of pixels.

Other detailed matters of the embodiments are included in the detailed description and the drawings.

According to the present disclosure, a deviation of the common voltage is reduced or minimized to uniformize a luminance of a stretchable display device.

According to the present disclosure, a wiring line for compensating for a pixel is disposed to improve a display quality.

According to the present disclosure, a touch line is provided to effectively sense the touch.

The effects according to the present disclosure are not limited to the contents exemplified above, and more various effects are included in the present specification.

BRIEF DESCRIPTION OF THE SEVERAL VIEWS OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
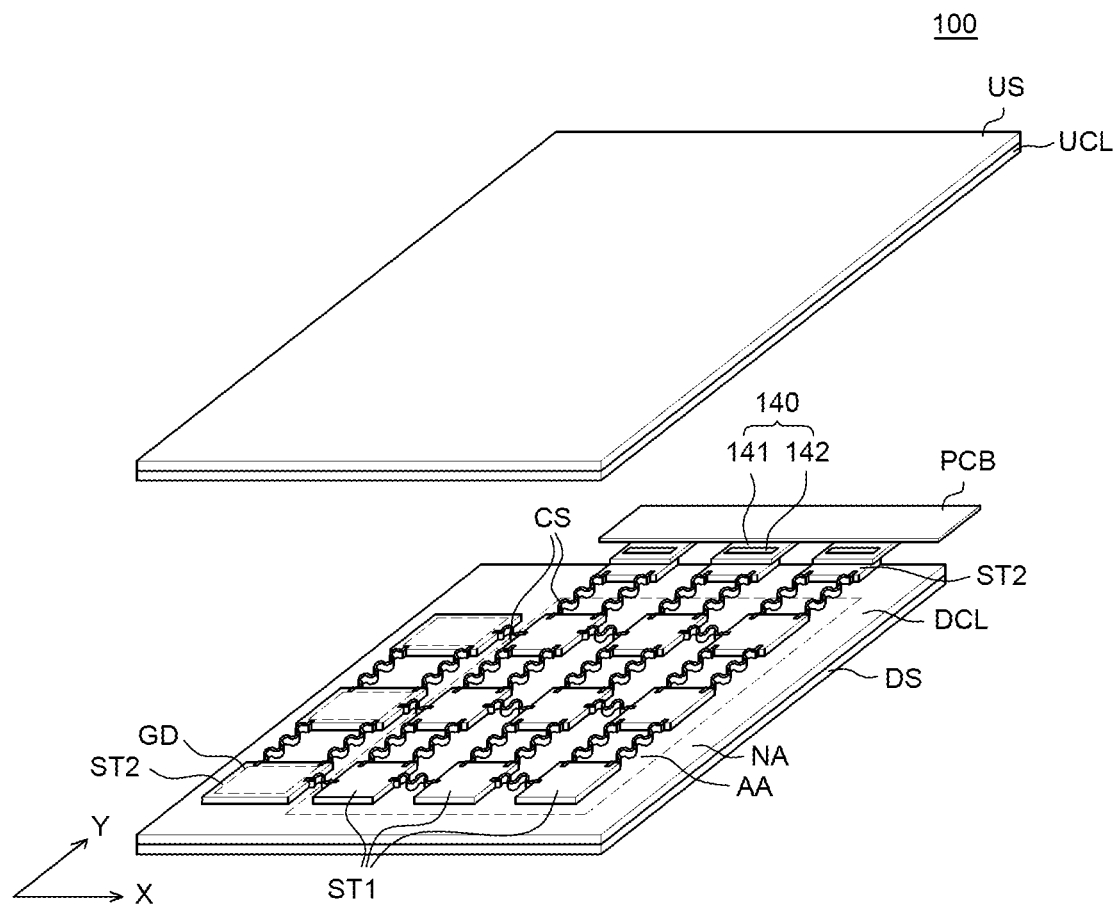
FIG. 1 is an exploded perspective view of a stretchable display device according to an embodiment of the present disclosure.

Advantages and characteristics of the present disclosure and a method of achieving the advantages and characteristics will be clear by referring to embodiments described below in detail together with the accompanying drawings. However, the present disclosure is not limited to the embodiments disclosed herein but will be implemented in various forms. The embodiments are provided by way of example only so that those skilled in the art can fully understand the disclosures of the present disclosure and the scope of the present disclosure.

The shapes, sizes, ratios, angles, numbers, and the like illustrated in the accompanying drawings for describing the embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having" used herein are generally intended to allow other components to be added unless the terms are used with the term "only." Any references to singular may include plural unless expressly stated otherwise.

Components are interpreted to include an ordinary error range even if not expressly stated.

When the position relation between two parts is described using the terms such as "on," "above," "below," and "next," one or more parts may be positioned between the two parts unless the terms are used with the term "immediately" or "directly."

When an element or layer is disposed "on" another element or layer, another layer or another element may be interposed directly on the other element or therebetween.

Although the terms "first," "second," and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a stretchable display device according to embodiments of the present disclosure will be described in detail with reference to accompanying drawings.

<Stretchable Display Device>

A stretchable display device may be referred to as a display device which is capable of displaying images even though the display device is bent or extended. The stretchable display device may have a high flexibility as compared with a general display device of the related art. Therefore, a shape of a stretchable display device may be freely changed in accordance with manipulation of a user to bend or extend a stretchable display device. For example, when the user holds ends of the stretchable display device to pull the stretchable display device, the stretchable display device may be extended by the force of the user. Alternatively, when the user disposes the stretchable display device on a wall surface which is not flat, the stretchable display device may be disposed to be bent in accordance with the shape of the surface of the wall surface. Further, when a force applied by the user is removed, the stretchable display device may return to its original shape.

FIG. 1 is an exploded perspective view of a stretchable display device according to an embodiment of the present disclosure.

Referring to FIG. 1, a stretchable display device 100 includes a lower substrate DS, a lower common electrode layer DCL, a plurality of first substrates ST1, a plurality of second substrates ST2, a plurality of connection substrates CS, a chip on film (COF) 140, a printed circuit board PCB, an upper common electrode layer UCL, and an upper substrate US.

The lower substrate DS is a substrate which supports and protects several components of the stretchable display device 100. The lower substrate DS which is a soft substrate or a flexible substrate may be configured by an insulating material which is bendable or stretchable. For example, the lower substrate DS may be formed of a silicon rubber such as polydimethylsiloxane (PDMS) or an elastomer such as polyurethane (PU) or polytetrafluoroethylene (PTFE) and thus have a flexible property. However, the material of the lower substrate DS is not limited thereto.

In some embodiments, the lower substrate DS is a soft substrate so as to be reversibly expanded and contracted. Further, an elastic modulus of the lower substrate DS may be several MPa to several hundreds of MPa, for example, may be 0.7 MPa to 1 MPa. Further, a ductile breaking rate of the lower substrate DS may be 100% or higher. Here, the ductile breaking rate refers to an extension distance when an object to be stretched is broken or cracked. That is, the ductile breaking rate is defined as a percentage ratio of a length of an original object and a length of the stretched object when an object has been stretched sufficiently that it is considered broken. For example, if a length of an object (e.g., lower substrate DS) is 100 cm when the object is not stretched and then, it reaches a length of 110 cm when the object has been stretched enough that it becomes broken or cracked at this length, then it was been stretched to 110% of its original length. In this case, the ductile breaking rate of the object is 110%. The number could thus also be called a ductile breaking ratio since it is a ratio of the stretched length as the numerator compared to the original un-stretched length as the denominator at the time the break occurs.

The object is considered broken when it can no longer function properly in the structure or circuit. For example, a wire that is a conductor would be considered broken when there is a sufficient degradation in its ability to carry current that it does not operate within the specifications of the circuit. Thus, in some embodiments, it might not require a full disconnection of the wire for it to be considered broken, a minor stress at a connection ends, a minor crack, a slight shift of the wire's location or other movement that causes it to no longer operate within its expected function would be considered a broken wire. If an insulator is stretched sufficiently that it no longer provides the amount of insulation needed for the structure or circuit, it would be considered broken. Breaking will also include in some embodiments a non-elastic stretching in which the object has been sufficiently stretched that it does not return to its original length and/or shape when it is no longer stretched. A thickness of the lower substrate DS may be 10 µm to 1 mm, but is not limited thereto.

On the lower substrate DS, a display area AA and a non-display area NA enclosing the display area AA may be defined.

The display area AA is an area in which an image is displayed in the stretchable display device 100 and a display element and various driving elements for driving the display element are disposed in the display area AA. The display area AA may include a plurality of pixels including a plurality of sub pixels. The plurality of pixels is disposed in the display area AA and includes a plurality of display elements. The plurality of sub pixels may be connected to various wiring lines, respectively. For example, each of the plurality of sub pixels may be connected not only to various wiring lines such as a gate line, a data line, an emission signal line, a reference voltage line, or a compensation signal line, but also to the lower common electrode layer DCL and the upper common electrode layer UCL electrically.

The non-display area NA is an area adjacent to the display area AA. The non-display area NA is adjacent to the display area AA to enclose the display area AA. In the non-display area NA, no image is displayed and wiring lines and circuit units may be formed. For example, in the non-display area NA, a plurality of pads may be disposed, and the pads may be connected to the plurality of sub pixels of the display areas AA, respectively.

The lower common electrode layer DCL may be disposed on the lower substrate DS. The lower common electrode layer DCL may be disposed on the entire surface of the lower substrate DS. That is, as illustrated in FIG. 1, the lower common electrode layer DCL may be disposed above the entire area of the lower substrate DS. However, the present disclosure is not limited thereto and depending on the necessity for a design, the lower common electrode layer DCL may be disposed only above a partial area of the lower substrate DS.

The lower common electrode layer DCL may be configured by a stretchable conductive material. That is, the lower common electrode layer DCL may be configured by a conductive material to serve as an electrode and also configured by a stretchable material to be applied to the stretchable display device 100. For example, the lower common electrode layer DCL may be implemented using PEDOT: PSS which is a stretchable conductive organic material. As another example, the lower common electrode layer DCL may be implemented using silver nano wires (AgNWs) or graphene which is a stretchable inorganic material. As still another example, the lower common electrode layer DCL may be implemented using a conductive material having a stretchable structure. The above-described stretchable structure may refer to a curved shape such as a sine wave shape or a zigzag pattern. However, other shape of the structures may be contemplated beyond the listed shapes above.

In some embodiments, it is beneficial for the lower common electrode layer DCL to extend together with the lower substrate DS so that an elastic modulus of the lower common electrode layer DCL may be equal or substantially equal to an elastic modulus of the lower substrate DS. Specifically, the elastic modulus of the lower common electrode layer DCL may be several KPa to several hundreds of MPa, for example, may be 100 KPa to 1 MPa. Further, a ductile breaking rate of the lower common electrode layer DCL may be 100% or higher. Therefore, since the extension rate of the lower common electrode layer DCL is equal or substantially equal to the extension rate of the lower substrate DS, even though the stretchable display device is repeatedly expanded and contracted, the crack at a boundary of the lower common electrode layer DCL and the lower substrate DS does not occur.

An equipotential voltage is applied to the lower common electrode layer DCL. Therefore, an equipotential voltage may be applied to all components which are electrically connected to the lower common electrode layer DCL, from the lower common electrode layer DCL. For example, a low potential common voltage may be applied to the lower common electrode layer DCL. As it will be described below, since the lower common electrode layer DCL may be electrically connected to the light emitting diode, the low potential common voltage may be stably supplied to the light emitting diode, by the lower common electrode layer DCL.

That is, the lower common electrode layer DCL is disposed on the entire surface of the lower substrate DS so that a deviation of the voltage which is supplied to the components disposed on the lower common electrode layer DCL may be reduced or minimized. By doing this, the driving reliability of the stretchable display device 100 may be improved.

The plurality of first substrates ST1 and the plurality of second substrates ST2 are disposed on the lower common electrode layer DCL. The plurality of first substrates ST1 may be disposed in the display area AA and the plurality of second substrates ST2 may be disposed in the non-display area NA. Even though in FIG. 1, the plurality of second substrates ST2 is disposed at an upper side and a left side of the display area AA in the non-display area NA, it is not limited thereto and may be disposed in an arbitrary area of the non-display area NA.

The plurality of first substrates ST1 and the plurality of second substrates ST2 are rigid substrates and are spaced apart from each other to be independently disposed on the lower substrate DS. The plurality of first substrates ST1 and the plurality of second substrates ST2 may be more rigid than the lower substrate DS. That is, the lower substrate DS may have a flexible characteristic more than the plurality of first substrates ST1 and the plurality of second substrates ST2 and the plurality of first substrates ST1 and the plurality of second substrates ST2 may have a rigid characteristic more than the lower substrate DS.

The plurality of first substrates ST1 and the plurality of second substrates ST2 which are rigid substrates may be formed of a plastic material having flexibility and for example, may be formed of polyimide (PI), polyacrylate, or polyacetate. In this case, the plurality of first substrates ST1 and the plurality of second substrates ST2 may be formed of the same material, but are not limited thereto and may be formed of different materials.

Moduli of the plurality of first substrates ST1 and the plurality of second substrates ST2 may be higher than that of the lower substrate DS. The modulus is an elastic modulus which represents a ratio being deformed by a stress with respect to a stress applied to the substrate. The higher the modulus, the higher a degree of hardness. Therefore, the plurality of first substrates ST1 and the plurality of second substrates ST2 may be a plurality of rigid substrates having rigidity as compared with the lower substrate DS. The moduli of the plurality of first substrates ST1 and the plurality of second substrates ST2 may be 1000 times higher than the modulus of the lower substrate DS, but are not limited thereto. For example, elastic moduli of the plurality of first substrates ST1 and the plurality of second substrates ST2 may be 2 GPa to 9 GPa depending on a transparency. More specifically, when the plurality of first substrates ST1 and the plurality of second substrates ST2 are transparent, the elastic modulus is 2 GPa and when the plurality of first substrates ST1 and the plurality of second substrates ST2 are opaque, the elastic modulus is 9 GPa.

The COF 140 is a film on which various components are disposed on a base film 141 having a flexibility and supplies signals to the plurality of sub pixels of the display area AA. The COF 140 may be bond to the plurality of pads of the plurality of second substrates ST2 disposed in the non-display area NA and supplies a power voltage, a data voltage, or a gate voltage to the plurality of sub pixels of the display area AA through the pads. The COF 140 includes the base film 141 and a driving IC 142. Further, various components may be additionally disposed thereon.

The base film 141 is a layer which supports the driving IC 142 of the COF 140. The base film 141 may be formed of an insulating material, and for example, may be formed of an insulating material having a flexibility.

The driving IC 142 is a component which processes data for displaying images and a driving signal for processing the images. In FIG. 1, even though it is illustrated that the driving IC 142 is mounted by the COF 140 technique, it is not limited thereto and the driving IC 142 may be mounted by chip on glass (COG) or tape carrier package (TCP).

In FIG. 1, one second substrate ST2 is disposed in the non-display area NA at the upper side of the display area AA so as to correspond to one row of first substrates ST1 disposed in the display area AA and one COF 140 is disposed for one second substrate ST2, but is not limited thereto. That is, one second substrate ST2 and one COF 140 may be disposed so as to correspond to the first substrates ST1 in a plurality of rows.

A control unit such as an IC chip or a circuit unit may be mounted on the printed circuit board PCB. Further, on the printed circuit board PCB, a memory or a processor may also be mounted. The printed circuit board PCB is a component which transmits a signal for driving the display element from the control unit to the display element. Even though in FIG. 1, it is described that one printed circuit board PCB is used, the number of printed circuit boards PCB is not limited thereto.

Hereinafter, the stretchable display device 100 according to the embodiment of the present disclosure will be described in more detail with reference to FIGS. 2 to 4 together.

Planar and Cross-Sectional Structures

Figure 2:
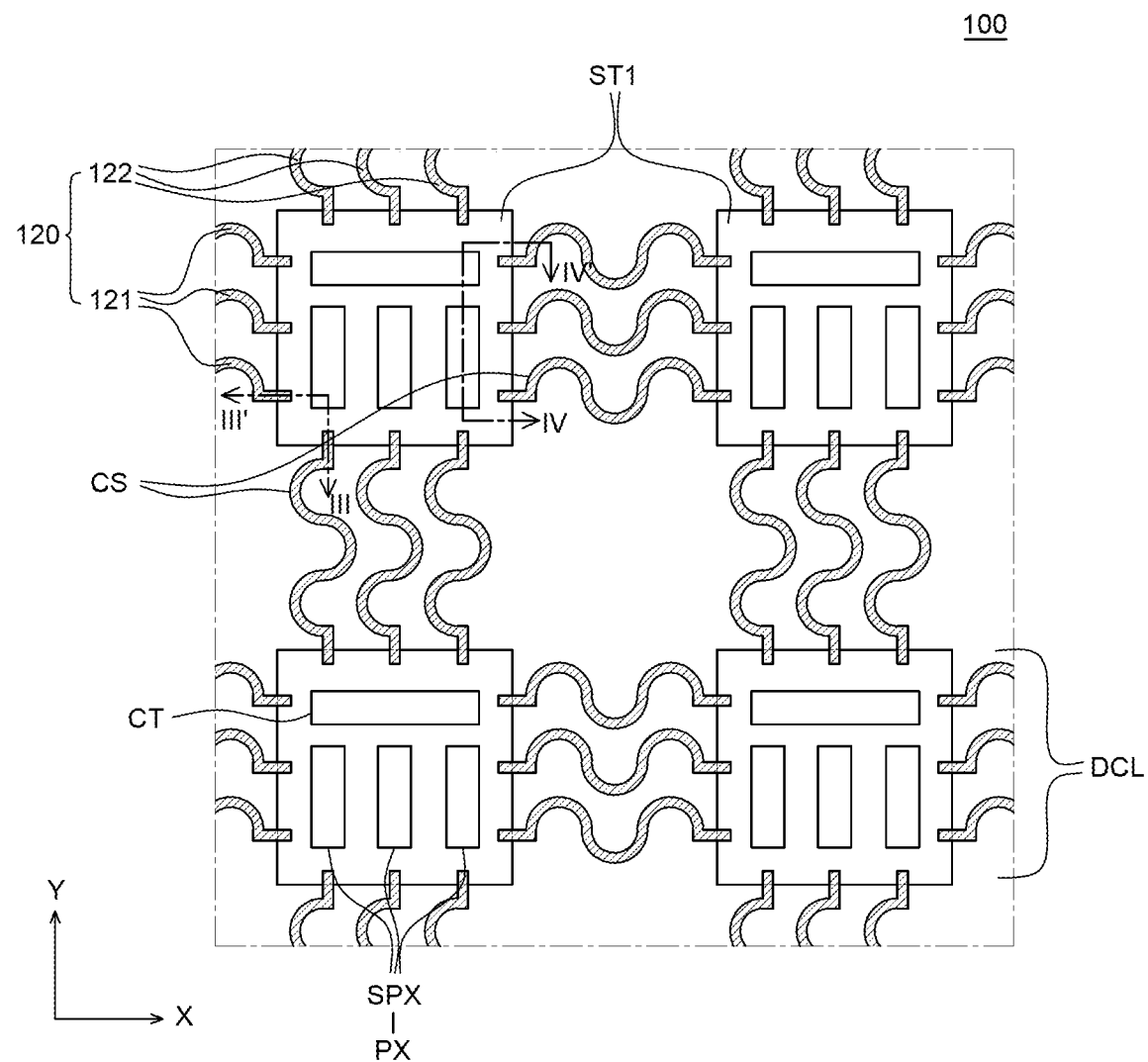
FIG. 2 is an enlarged plan view of a stretchable display device according to an embodiment of the present disclosure.

FIG. 2 is an enlarged plan view of a stretchable display device according to an embodiment of the present disclosure. FIG. 3 is a cross-sectional view taken along the line III-III' of FIG. 2. FIG. 4 is a cross-sectional view taken along the line IV-IV' of FIG. 2. For the convenience of description, the stretchable display device 100 according to the embodiment of the present disclosure will be described with reference to FIG. 1 together.

Figure 3:
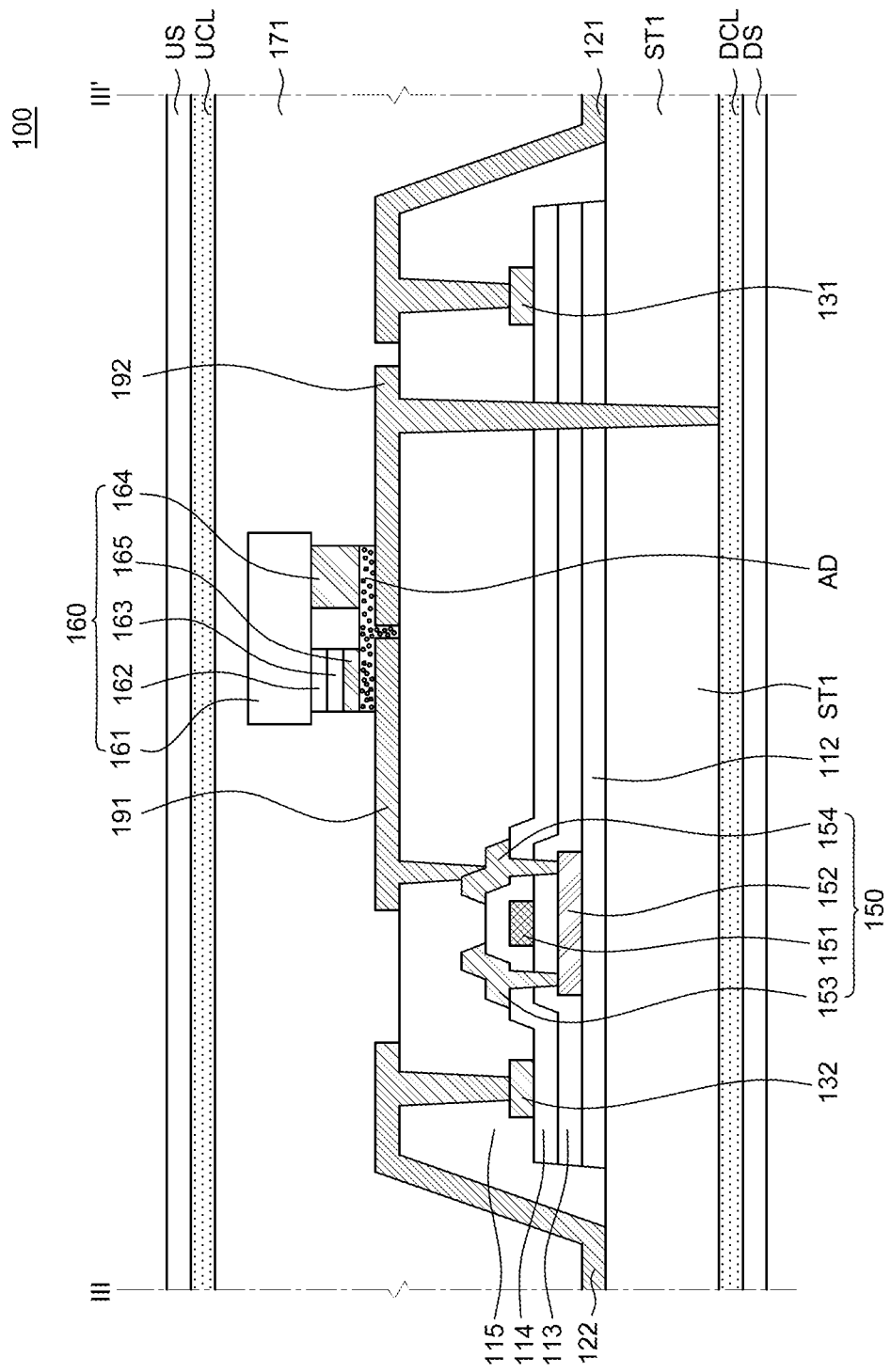
FIG. 3 is a cross-sectional view taken along the line III-III' of FIG. 2.
Figure 4:
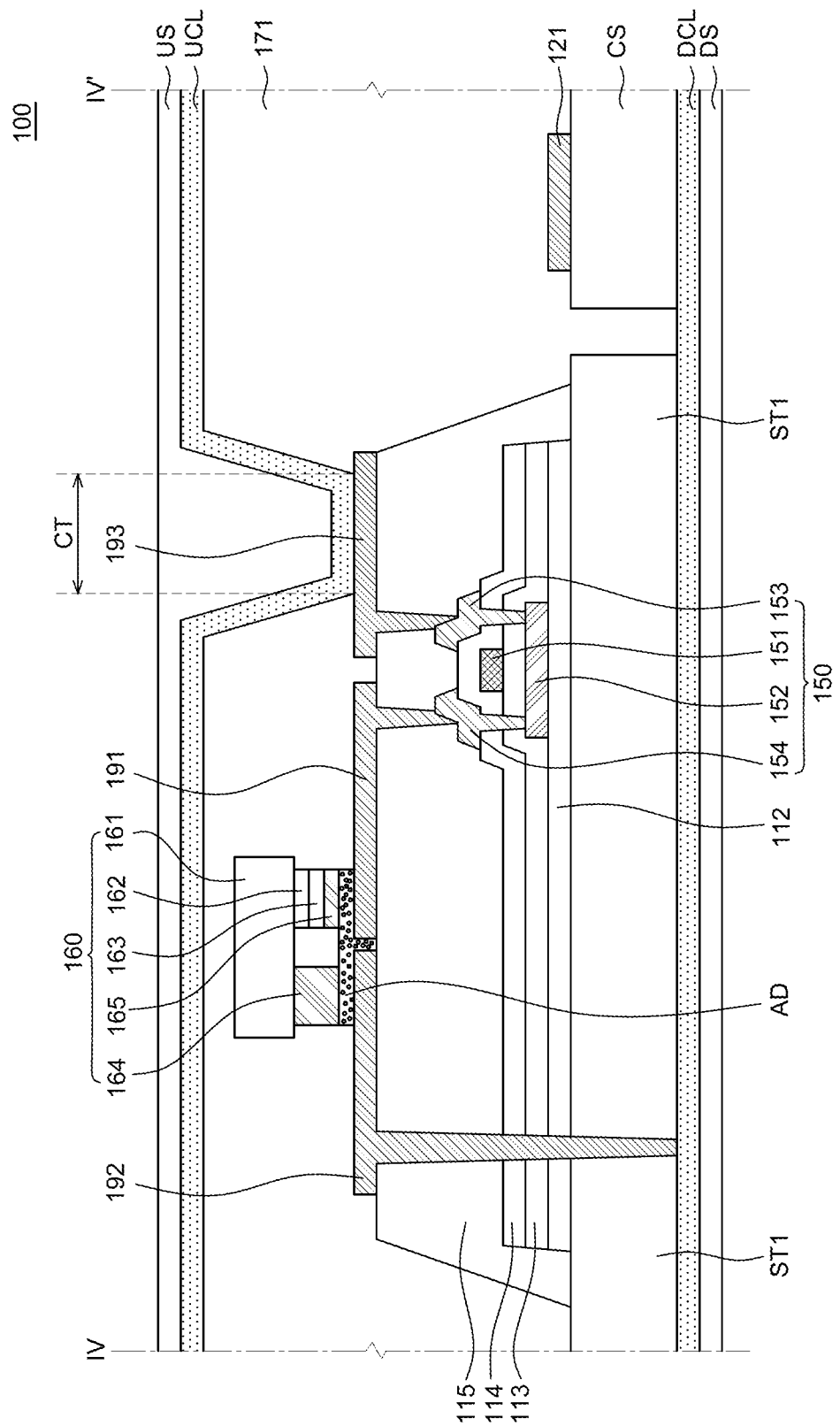
FIG. 4 is a cross-sectional view taken along the line IV-IV' of FIG. 2.

Referring to FIGS. 2 to 4, the stretchable display device 100 includes a lower substrate DS, a lower common electrode layer DCL, a plurality of first substrates ST1, a plurality of connection substrates CS, a plurality of connection lines 120, a plurality of pads, a transistor 150, an LED 160, a cover insulating layer 171, an upper common electrode layer UCL, and an upper substrate US.

Referring to FIGS. 1 and 2, the plurality of first substrates ST1 is disposed on the lower common electrode layer DCL disposed in the display area AA. The plurality of first substrates ST1 is spaced apart from each other to be disposed on the lower common electrode layer DCL. For example, as illustrated in FIGS. 1 and 2, the plurality of first substrates ST1 may be disposed on the lower common electrode layer DCL in a matrix, but is not limited thereto.

Referring to FIGS. 1 and 2, in the plurality of first substrates ST1, a plurality of sub pixels SPX which configures a plurality of pixels PX may be disposed and a contact area CT may be disposed at one side of the plurality of sub pixels SPX. For example, even though in FIG. 2, it is illustrated that the contact area CT is disposed to be adjacent to the plurality of sub pixels SPX in a Y-axis direction, but is not limited thereto the arrangement relationship may vary depending on the necessity for a design on the first substrate ST1.

Further, a gate driver GD may be mounted in a second substrate ST2 which is located at a left side of the display area AA, among the plurality of second substrates ST2. The gate driver GD may be formed on the second substrate ST2 in a gate in panel (GIP) manner when various elements on the first substrate ST1 are manufactured. Therefore, various circuit configurations which configure the gate driver GD, such as various transistors, capacitors, and wiring lines may be disposed on the plurality of second substrates ST2. However, it is not limited thereto and the gate driver GD may be mounted in a chip on film (COF) manner. Further, the plurality of second substrates ST2 is also disposed in the non-display area NA located at a right side of the display area AA and the gate driver GD may be mounted also on the plurality of second substrates ST2 located at the right side of the display area AA.

Referring to FIG. 1, a size of the plurality of second substrates ST2 may be larger than a size of the plurality of first substrates ST1. Specifically, a size of each of the plurality of second substrates ST2 may be larger than a size of each of the plurality of first substrates ST1. As described above, on each of the plurality of second substrates ST2, the gate driver GD is disposed. For example, one stage of the gate driver GD may be disposed on each of the plurality of second substrates ST2. Therefore, an area occupied by various circuit configurations which configure one stage of the gate driver GD is relatively larger than an area of the first substrate ST1 on which the pixel PX is disposed. As a result, a size of each of the plurality of second substrates ST2 may be larger than a size of each of the plurality of first substrates ST1.

Referring to FIGS. 1 and 2, the plurality of connection substrates CS is disposed between the plurality of first substrates ST1, between the plurality of second substrates ST2, or between the plurality of first substrates ST1 and the plurality of second substrates ST2. The plurality of connection substrates CS may be substrates which connect adjacent first substrates ST1, adjacent second substrates ST2, or the first substrate ST1 and the second substrate ST2 which are adjacent to each other. The plurality of connection substrates CS may be simultaneously and integrally formed with the same material as the plurality of first substrates ST1 or the plurality of second substrates ST2, but is not limited thereto.

Referring to FIG. 2, the plurality of connection substrates CS has a curved shape on a flat surface. For example, as illustrated in FIG. 2, the plurality of connection substrates CS may have a sine wave shape. However, the shape of the plurality of connection substrates CS is not limited thereto, and, for example, the plurality of connection substrates CS may extend with a zigzag pattern or may be formed with various shapes such as a shape extended by connecting a plurality of rhombus-shaped substrates at vertexes. Further, the number and the shape of the plurality of connection substrates CS illustrated in FIG. 2 are illustrative and the number and the shape of the plurality of connection substrates CS may vary depending on the design.

Referring to FIG. 3, a buffer layer 112 is disposed on the plurality of first substrates ST1. The buffer layer 112 is formed on the plurality of first substrates ST1 to protect various components of the stretchable display device 100 from permeation of moisture $H_2O$ and oxygen $O_2$ from the outside of the lower substrate DS, the lower common electrode layer DCL, and the plurality of first substrates ST1. The buffer layer 112 may be configured by an insulating material and for example, configured by a single layer or a double layer of an inorganic layer formed of silicon nitride (SiNx), silicon oxide (SiOx), and silicon oxynitride (SiON). However, the buffer layer 112 may be omitted depending on a structure or a characteristic of the stretchable display device 100.

The buffer layer 112 may be formed only in an area where the lower substrate DS overlaps with the plurality of first substrates ST1 and the plurality of second substrates ST2. As described above, the buffer layer 112 may be formed of an inorganic material so that the buffer layer 112 may be easily cracked or damaged during a process of extending the stretchable display device 100. In this case, the buffer layer 112 is not formed in an area between the plurality of first substrates ST1 and the plurality of second substrates ST2, but is patterned to have a shape of the plurality of first substrates ST1 and the plurality of second substrates ST2 to be disposed only above the plurality of first substrates ST1 and the plurality of second substrates ST2. In other words, the buffer layer 112 may not be formed on the plurality of connection substrates CS. Therefore, in the stretchable display device 100 according to the embodiment of the present disclosure, the buffer layer 112 is formed only in an area overlapping with the plurality of first substrates ST1 and the plurality of second substrates ST2 which are rigid substrates. Therefore, even though the stretchable display device 100 is bent or extended to be deformed, the damage of the buffer layer 112 may be suppressed.

Referring to FIG. 3, the transistor 150 including a gate electrode 151, an active layer 152, a source electrode 153, and a drain electrode 154 is formed on the buffer layer 112.

First, referring to FIG. 3, the active layer 152 is disposed on the buffer layer 112. For example, the active layer 152 may be formed of an oxide semiconductor, amorphous silicon (a-Si), polycrystalline silicon (poly-Si), or an organic semiconductor.

A gate insulating layer 113 is disposed on the active layer 152. The gate insulating layer 113 is a layer for electrically insulating the gate electrode 151 from the active layer 152 and may be formed of an insulating material. For example, the gate insulating layer 113 may be formed as a single layer of silicon nitride (SiNx) or silicon oxide (SiOx) which is an inorganic material or a multi-layer of silicon nitride (SiNx) or silicon oxide (SiOx), but it is not limited thereto.

The gate electrode 151 is disposed on the gate insulating layer 113. The gate electrode 151 is disposed to overlap with the active layer 152. The gate electrode 151 may be any one of various metal materials, for example, any one of molybdenum (Mo), aluminum (Al), chrome (Cr), gold (Au), titanium (Ti), nickel (Ni), neodymium (Nd), and copper (Cu) or an alloy of two or more of them, or a multi-layer thereof, but it is not limited thereto.

An interlayer insulating layer 114 is disposed on the gate electrode 151. The interlayer insulating layer 114 is a layer which insulates the gate electrode 151 from the source electrode 153 and the drain electrode 154 and may be formed of an inorganic material, similarly to the buffer layer 112. For example, the interlayer insulating layer 114 may be configured by a single layer of silicon nitride (SiNx) or silicon oxide (SiOx) which is an inorganic material or a multi-layer of silicon nitride (SiNx) or silicon oxide (SiOx), but it is not limited thereto.

The source electrode 153 and the drain electrode 154 which are in contact with the active layer 152 are disposed on the interlayer insulating layer 114. The source electrode 153 and the drain electrode 154 are disposed on the same layer to be spaced apart from each other. The source electrode 153 and the drain electrode 154 may be in contact with the active layer 152 to be electrically connected to the active layer 152. The source electrode 153 and the drain electrode 154 may be any one of various metal materials such as molybdenum (Mo), aluminum (Al), chrome (Cr), gold (Au), titanium (Ti), nickel (Ni), neodymium (Nd), and copper (Cu) or an alloy of two or more of them, or a multi-layer thereof, but it is not limited thereto.

Further, the gate insulating layer 113 and the interlayer insulating layer 114 are patterned to be formed only in an area overlapping with the plurality of first substrates ST1. The gate insulating layer 113 and the interlayer insulating layer 114 may be also formed of the inorganic material, similarly to the buffer layer 112, so that the gate insulating layer 113 and the interlayer insulating layer 114 may also be easily cracked to be damaged during the process of extending the stretchable display device 100. Therefore, the gate insulating layer 113 and the interlayer insulating layer 114 are not formed in an area between the plurality of first substrates ST1, but are patterned to have a shape of the plurality of first substrates ST1 to be formed only above the plurality of first substrates ST1.

In FIG. 3, even though among various transistors which may be included in the stretchable display device 100, only a driving transistor is illustrated for the convenience of description, a switching transistor or a capacitor may also be included in the display device. Further, in this specification, even though it is described that the transistor 150 has a coplanar structure, various transistors such as a staggered transistor may also be used.

Referring to FIG. 3, a plurality of pads is disposed on the interlayer insulating layer 114. In the drawing, even though it is illustrated that the plurality of pads is disposed on the first substrates ST1, the plurality of pads may also be disposed on the second substrates ST2. The plurality of pads may be pads which transmit any one of various signals such as a gate signal, a data signal, an emission signal, a reference voltage signal, and a compensation signal to the plurality of sub pixels SPX, but is not limited thereto. Further, the plurality of pads may be formed of the same material as the source electrode 153 and the drain electrode 154, but is not limited thereto.

The plurality of pads includes a first pad 131 and a second pad 132. The first pad 131 may be connected to a first connection line 121. Further, the second pad 132 may be connected to a second connection line 122.

Referring to FIG. 3, a planarization layer 115 is formed on the transistor 150 and the interlayer insulating layer 114. The planarization layer 115 planarizes an upper portion of the transistor 150. The planarization layer 115 may be configured by a single layer or a plurality of layers and may be formed of an organic material. Therefore, the planarization layer 115 may also be referred to as an organic insulating layer. For example, the planarization layer 115 may be formed of an acrylic-based organic material, but is not limited thereto.

Referring to FIG. 3, the planarization layer 115 is disposed on the plurality of first substrates ST1 to cover top surfaces and side surfaces of the buffer layer 112, the gate insulating layer 113, and the interlayer insulating layer 114 to enclose the buffer layer 112, the gate insulating layer 113, and the interlayer insulating layer 114 together with the plurality of first substrates ST1. Specifically, the planarization layer 115 may be disposed so as to cover or at least partially cover a top surface and a side surface of the interlayer insulating layer 114, a side surface of the gate insulating layer 113, a side surface of the buffer layer 112, and a part of a top surface of the plurality of first substrates ST1.

The planarization layer 115 may supplement a step on the side surfaces of the buffer layer 112, the gate insulating layer 113, and the interlayer insulating layer 114 and enhance an adhesive strength of the planarization layer 115 and the connection line 120 disposed on the side surface of the planarization layer 115. For example, the side surface of the planarization layer 115 may have a slope which is gentler than a slope formed by a side surface of the interlayer insulating layer 114, a side surface of the gate insulating layer 113, and a side surface of the buffer layer 112. Therefore, the connection line 120 which is disposed to be in contact with the side surface of the planarization layer 115 is disposed with a gentle slope so that when the stretchable display device 100 is extended, a stress generated in the connection line 120 is reduced. Further, the crack occurring in the connection line 120 or a separation from the side surface of the planarization layer 115 may be suppressed.

In some embodiments, a passivation layer (not shown) may be formed between the transistor 150 and the planarization layer 115. That is, the passivation layer may be formed to cover the transistor 150 to protect the transistor 150 from the permeation of the moisture and oxygen as well as other foreign, external materials. The passivation layer may be formed of an inorganic material and configured by a single layer or a plurality of layers, but is not limited thereto.

Referring to FIG. 3, a first connection pad 191 and a second connection pad 192 are disposed on the planarization layer 115. The first connection pad 191 is an electrode which electrically connects an LED 160 to be described below and the transistor 150. For example, the first connection pad 191 may electrically connect the drain electrode 154 of the transistor 150 and the LED 160 through a contact hole formed in the planarization layer 115. In some embodiments, the second connection pad 192 extends through the planarization layer 115 to contact the lower common electrode layer DCL and extends laterally to contact the LED 160.

The second connection pad 192 is an electrode which electrically connects the LED 160 and the lower common electrode layer DCL. For example, the second connection pad 192 may electrically connect the lower common electrode layer DCL and the LED 160 through contact holes formed in the first substrate ST1, the buffer layer 112, the gate insulating layer 113, the interlayer insulating layer 114, and the planarization layer 115.

As described above, a low potential common voltage may be applied to the lower common electrode layer DCL. Further, the second connection pad 192 may electrically connect the lower common electrode layer DCL to the LED 160 which is a light emitting diode so that a low potential common voltage may be applied to the LED 160 through the second connection pad 192.

In the stretchable display device of the related art, a common line which applies the low potential common voltage is separately formed. The common line is a wiring line which extends in one direction so that a resistance is relatively high and an area for forming a separate wiring line is beneficial.

In the meantime, in the stretchable display device according to the embodiment of the present disclosure, a common line is removed and the lower common electrode layer DCL formed on the entire surface of the lower substrate DS is formed. Further, the lower common electrode layer DCL and the LED 160 are electrically connected through the second connection pad 192 to apply a low potential common voltage.

That is, the stretchable display device 100 according to the embodiment of the present disclosure includes a sheet type lower common electrode layer DCL to drastically reduce the resistance of the lower common electrode layer DCL. Therefore, voltage drop of the low potential common voltage which is applied to the lower common electrode layer DCL due to the resistance may be reduced or minimized. Accordingly, the low potential common voltage which is applied to the lower common electrode layer DCL is uniformly maintained to reduce or minimize the deviation of the low potential common voltage supplied to all pixels PX. By doing this, the luminance of the stretchable display device 100 may be uniformized.

Furthermore, the stretchable display device according to the embodiment of the present disclosure does not need to form a separate common line so that the existing common line may be used as a wiring line for compensating for a pixel. By doing this, a compensation circuit of the stretchable display device may be provided to drastically improve the image quality.

Further, in the stretchable display device 100 according to the embodiment of the present disclosure, the common line may be eliminated so that another component may be disposed in the area from which the common line is eliminated or designs for the existing wiring lines may be diversified. Therefore, the designs of the stretchable display device 100 may be diversified.

Referring to FIG. 3, the LED 160 is disposed on the first connection pad 191 and the second connection pad 192. The LED 160 includes an n-type layer 161, an active layer 162, a p-type layer 163, an n-electrode 164, and a p-electrode 165. The LED 160 of the stretchable display device 100 according to the embodiment of the present disclosure has a flip-chip structure in which the n-electrode 164 and the p-electrode 165 are formed on one surface.

The n-type layer 161 may be formed by injecting an n-type impurity into gallium nitride (GaN). The n-type layer 161 may be disposed on a separate base substrate which is formed of a material which is capable of emitting light.

The active layer 162 is disposed on the n-type layer 161. The active layer 162 is a light emitting layer which emits light in the LED 160 and may be formed of a nitride semiconductor, for example, indium gallium nitride (InGaN). The p-type layer 163 is disposed on the active layer 162. The p-type layer 163 may be formed by injecting a p-type impurity into gallium nitride (GaN).

As described above, the LED 160 according to the embodiment of the present disclosure is manufactured by sequentially laminating the n-type layer 161, the active layer 162, and the p-type layer 163, and then etching a predetermined part to form the n-electrode 164 and the p-electrode 165. In this case, the predetermined part which is a space for separating the n-electrode 164 and the p-electrode 165 from each other is etched to expose a part of the n-type layer 161. In other words, the surfaces of the LED 160 on which the n-electrode 164 and the p-electrode 165 are disposed are not flat surfaces, but may have different height levels.

As described above, in the etched area, in other words, on the n-type layer 161 exposed by the etching process, the n-electrode 164 is disposed. The n-electrode 164 may be formed of a conductive material. In the meantime, in an area which is not etched, in other words, on the p-type layer 163, the p-electrode 165 is disposed. The p-electrode 165 may be also formed of a conductive material, and for example, may be formed of the same material as the n-electrode 164.

However, as described above, in the stretchable display device 100 according to the embodiment of the present disclosure, the light emitting diode is described as an LED 160, but is not limited thereto and the light emitting diode may expand to various diodes such as an organic light emitting diode (OLED).

An adhesive layer AD is disposed on top surfaces of the first connection pad 191 and the second connection pad 192 and between the first connection pad 191 and the second connection pad 192 so that the LED 160 may be bonded onto the first connection pad 191 and the second connection pad 192. In this case, the n-electrode 164 may be disposed on the second connection pad 192 and the p-electrode 165 may be disposed on the first connection pad 191.

The adhesive layer AD may be a conductive adhesive layer in which conductive balls are dispersed in an insulating base member. Therefore, when heat or pressure is applied to the adhesive layer AD, the conductive balls are electrically connected in a portion applied with heat or pressure to have a conductive property and an area which is not pressurized may have an insulating property. For example, the n-electrode 164 is electrically connected to the second connection line 122 by means of the adhesive layer AD and the p-electrode 165 is electrically connected to the first connection line 121 by means of the adhesive layer AD. That is, after applying the adhesive layer AD on the first connection pad 191 and the second connection pad 192 using an inkjet method, the LED 160 is transferred onto the adhesive layer AD and the LED 160 is pressurized and heated. By doing this, the first connection pad 191 may be electrically connected to the p-electrode 165 and the second connection pad 192 may be electrically connected to the n-electrode 164. However, the remaining part of the adhesive layer AD excluding a part of the adhesive layer AD disposed between the n-electrode 164 and the second connection pad 192 and a part of the adhesive layer AD disposed between the p-electrode 165 and the first connection pad 191 has an insulating property. In the meantime, the adhesive layer AD may be divided to be disposed on the first connection pad 191 and the second connection pad 192, respectively.

As described above, the stretchable display device 100 according to the embodiment of the present disclosure has a structure in which the LED 160 is disposed on the lower substrate DS on which the transistor 150 is disposed. Therefore, when the stretchable display device 100 is turned on, different voltage levels which are applied to the first connection pad 191 and the second connection pad 192 are transmitted to the n-electrode 164 and the p-electrode 165 so that the LED 160 emits light.

Specifically, the p-electrode 165 and the drain electrode 154 of the transistor 150 are electrically connected by the first connection pad 191 so that a voltage output from the drain electrode 154 of the transistor 150 may be applied to the p-electrode 165. Further, the n-electrode 164 and the lower common electrode layer DCL are electrically connected by the second connection pad 192 so that a low potential common voltage applied to the lower common electrode layer DCL may be applied to the n-electrode 164. That is, different voltages are applied to the p-electrode 165 and the n-electrode 164 so that the LED 160 emits light by the voltage difference.

In the meantime, even though in FIG. 3, it is illustrated that a bank is not used, the bank may be formed on the first connection pad 191, the second connection pad 192, the connection line 120, and the planarization layer 115. The bank may divide sub pixels which are disposed on one side and the other side of the LED 160 to be adjacent to each other. The bank may be formed of an insulating material. Further, the bank may include a black material. The bank includes the black material to block wiring lines which may be visible through the display area AA. For example, the bank may be formed of a transparent carbon-based mixture and specifically, include carbon black. However, it is not limited thereto and the bank may be formed of a transparent insulating material.

Referring to FIGS. 2 to 4, the plurality of connection lines 120 is disposed on the planarization layer 115 and the plurality of connection substrates CS. The plurality of connection lines 120 refers to wiring lines which electrically connect a plurality of pads which is adjacent to each other. In this case, the connection line 120 and the pad may be connected to each other through a contact hole formed in the planarization layer 115.

The plurality of connection lines 120 may be configured by one of various wiring lines such as a gate line, a data line, an emission signal line, a reference voltage line, and a compensation signal line, but is not limited thereto. However, the high potential common voltage is supplied by the upper common electrode layer UCL and the low potential common voltage is supplied by the lower common electrode layer DCL so that the high potential common voltage or the low potential common voltage is not supplied by the plurality of connection lines 120. The plurality of connection lines 120 is disposed between two adjacent first substrates ST1 to electrically connect two first substrates ST1. Specifically, the plurality of connection lines 120 is disposed on the connection substrate CS which connects two adjacent first substrates ST1 and two adjacent second substrates ST2. Further, the plurality of connection lines 120 may be disposed between two adjacent second substrates ST2 and between the first substrate ST1 and the second substrate ST2 which are adjacent to each other.

In an area corresponding to the connection substrates CS, the plurality of connection lines 120 is formed to have the same shape as the plurality of connection substrates CS to overlap with each other. That is, the plurality of connection lines 120 may have the same curved shape as the plurality of connection substrates CS above the plurality of connection substrates CS.

The plurality of connection lines 120 includes the first connection line 121 and the second connection line 122. The first connection line 121 and the second connection line 122 may be disposed between the plurality of first substrates ST1, between the plurality of second substrates ST2, or between the plurality of first substrates ST1 and the plurality of second substrates ST2.

The first connection line 121 may be formed to extend to a top surface of the connection substrate CS while being in contact with a top surface and a side surface of the planarization layer 115 disposed on the first substrate ST1. Further, the second connection line 122 may be formed to extend to the top surface of the connection substrate CS while being in contact with a top surface and a side surface of the planarization layer 115 disposed on the first substrate ST1.

In FIGS. 1 and 2, the first connection line 121 may refer to a wiring line extending in an X-axis direction among the plurality of connection lines 120 and the second connection line 122 may refer to a wiring line extending in a Y-axis direction among the plurality of connection lines 120. The first connection line 121 and the second connection line 122 may be configured to transmit different signals to the plurality of sub pixels SPX. That is, a signal transmitted by the first connection line 121 may be different from a signal transmitted by the second connection line 122.

The plurality of connection lines 120 may be formed of a metal material such as copper (Cu), aluminum (Al), titanium (Ti), and molybdenum (Mo) or a stacked structure of metal materials such as copper/molybdenum-titanium (Cu/Moti) or titanium/aluminum/titanium (Ti/Al/Ti), but is not limited thereto.

The display device includes various signal lines such as a gate line, a data line, an emission signal line, a high potential power line, a low potential power line, a reference voltage line, or a compensation signal line. In the case of a general display device, various signal lines extend as a straight line between the plurality of sub pixels and the plurality of sub pixels is connected to one signal line. Therefore, in the general display device, various signal lines extend from one side of the display device to the other side without being disconnected on the substrate.

In contrast, in the case of the stretchable display device 100 according to the embodiment of the present disclosure, a straight signal line which is considered to be used for the general display device is disposed only on the plurality of first substrates ST1 and the plurality of second substrates ST2. That is, in the stretchable display device 100 according to the embodiment of the present disclosure, a straight signal line may be disposed only on the plurality of first substrates ST1 and the plurality of second substrates ST2.

In the stretchable display device 100 according to the embodiment of the present disclosure, in order to connect discontinuous wiring lines on the first substrate ST1 or the second substrate ST2, the pads on the adjacent substrates ST1 and ST2 may be connected by the connection lines 120. That is, the connection line 120 electrically connects pads on two adjacent first substrates ST1, on two adjacent second substrates ST2, and on the first substrate ST1 and the second substrate ST2. Therefore, in the stretchable display device 100 according to the embodiment of the present disclosure, straight signal lines on the plurality of first substrates ST1 and the plurality of second substrates ST2 may be electrically connected to each other by the plurality of connection lines 120.

For example, the gate line may be disposed on the plurality of first substrates ST1 disposed to be adjacent to each other in the X-axis direction and the gate pad may be disposed on both ends of the gate line. For example, the first pad 131 may be one of gate pads disposed on both ends of the gate line of the sub pixel SPX. The first connection line 121 may serve as a gate line. Further, the first pad 131 on the plurality of first substrates ST1 which are adjacent to each other in the X-axis direction may be connected to each other by the first connection line 121 on the connection substrate CS. Therefore, the gate line disposed on the plurality of first substrates ST1 and the first connection line 121 disposed on the connection substrate CS may serve as one gate line. Accordingly, one gate signal may be transmitted to the gate electrode 151 of the plurality of sub pixels SPX through the first pad 131, the first connection line 121, and the gate lines disposed on the plurality of first substrates ST1.

Further, the data line may be disposed on the plurality of first substrates ST1 disposed to be adjacent to each other in the Y-axis direction and a data pad may be disposed on both ends of the data line. For example, the second pad 132 may be one of data pads disposed on both ends of the data line of the sub pixel SPX. The second connection line 122 may serve as a data line. The second pad 132 on the plurality of first substrates ST1 which are adjacent to each other in the Y-axis direction and another pad may be connected to each other by the second connection line 122 on the connection substrate CS. Therefore, the data line disposed on the plurality of first substrates ST1 and the second connection line 122 disposed on the connection substrate CS may serve as one data line. Accordingly, one data signal may be transmitted to the plurality of sub pixels SPX through the second pad 132, another pad, the second connection line 122, and the data lines disposed on the plurality of first substrates ST1.

Further, the connection line 120 may further include a wiring line which connects pads on the plurality of first substrates ST1 and the plurality of second substrates ST2 to each other or connects pads on two second substrates ST2 which are disposed to be parallel, among pads on the plurality of second substrates ST2 adjacent in the Y-axis direction.

The cover insulating layer 171 is disposed to cover or at least partially cover the LED 160 and the connection line 120. The cover insulating layer 171 electrically insulates the LED 160 and the connection line 120 from components disposed thereabove. As it will be described below, the upper common electrode layer UCL is disposed above the cover insulating layer 171 and the cover insulating layer 171 electrically insulates the LED 160 and the connection line 120 from the upper common electrode layer UCL.

Further, the cover insulating layer 171 planarizes an upper portion of the LED 160 and the connection line 120 to reduce a step. That is, referring to FIG. 4, the LED 160 is disposed above the first substrate ST1 and the transistor 150 and the first connection line 121 is disposed above the connection substrate CS so that there is a step between the LED 160 and the first connection line 120. The cover insulating layer 171 is disposed to cover both the LED 160 and the connection line 120 to reduce or minimize a step.

The cover insulating layer 171 may be configured by a single layer or a plurality of layers and may be formed of an organic material. For example, the cover insulating layer 171 may be formed of an acrylic-based organic material, but is not limited thereto.

However, in FIG. 4, even though it is illustrated that one cover insulating layer 171 covers all the upper portions of the LED 160 and the first connection line 121, the present disclosure is not limited thereto. Therefore, the cover insulating layer 171 may be divided into a first cover insulating pattern which covers only the upper portion of the LED 160 to insulates the LED 160 from the upper common electrode layer UCL and a second cover insulating pattern which covers only the upper portion of the first connection line 121 to insulate the first connection line 121 from the upper common electrode layer UCL.

The upper common electrode layer UCL may be disposed on the cover insulating layer 171. The upper common electrode layer UCL may be disposed on the entire surface of the cover insulating layer 171. In other words, as illustrated in FIG. 1, the upper common electrode layer UCL may be disposed below the entire area of the upper substrate US. However, the present disclosure is not limited thereto and depending on the necessity for a design, the upper common electrode layer UCL may be disposed only below a partial area of the upper substrate US.

The upper common electrode layer UCL may be configured by a stretchable conductive material. That is, the upper common electrode layer UCL may be configured not only by a conductive material to serve as an electrode, but also by a stretchable material to be applied to the stretchable display device. For example, the upper common electrode layer UCL may be implemented using PEDOT:PSS which is a stretchable conductive organic material. As another example, the upper common electrode layer UCL may be implemented using silver nano wires (AgNWs) or graphene which is a stretchable inorganic material. As still another example, the upper common electrode layer UCL may be implemented using a conductive material having a stretchable structure. The above stretchable structure may refer to a curved shape such as a sine wave shape or a zigzag pattern. However, other shape of the structures may be contemplated beyond the listed shapes above.

In some embodiments, it is beneficial for the upper common electrode layer UCL to extend together with the upper substrate US so that the elastic modulus of the upper common electrode layer UCL may be equal or substantially equal to the elastic modulus of the upper substrate US. Specifically, the elastic modulus of the upper common electrode layer UCL may be several KPa to several hundreds of MPa, for example, may be 100 KPa to 1 MPa. Further, a ductile breaking rate of the upper common electrode layer UCL may be 100% or higher. Therefore, since the extension rate of the upper common electrode layer UCL is equal or substantially equal to the extension rate of the upper substrate US, even though the stretchable display device 100 repeatedly expands and contracts, the crack at a boundary of the upper common electrode layer UCL and the upper substrate US does not occur.

An equipotential voltage is applied to the upper common electrode layer UCL. Therefore, an equipotential voltage may be applied to all components which are electrically connected to the upper common electrode layer UCL, from the upper common electrode layer UCL. For example, a high potential common voltage may be applied to the upper common electrode layer UCL.

As illustrated in FIG. 4, in the contact area CT, the upper common electrode layer UCL is in contact with the third connection pad 193 and the third connection pad 193 is in contact with the source electrode 153 of the transistor 150 through the contact hole of the planarization layer 115. That is, the upper common electrode layer UCL, the third connection pad 193, and the source electrode 153 of the transistor 150 are electrically connected. Therefore, a high potential common voltage may be applied to the upper common electrode layer UCL so that the high potential common voltage may be applied to the source electrode 153 of the transistor 150. In some embodiments, the third connection pad 193 extends through the planarization layer 115 to contact the at least one transistor, and the third connection pad 193 extends laterally to contact the upper common electrode layer UCL.

In the stretchable display device of the related art, a common line which applies the high potential common voltage is separately formed. The common line is a wiring line which extends in one direction so that a resistance is relatively high and an area for forming a separate wiring line is beneficial.

In the meantime, in the stretchable display device according to the embodiment of the present disclosure, a common line is removed and the upper common electrode layer UCL formed on the entire surface of the cover insulating layer 171 is formed. Further, the upper common electrode layer UCL and the source electrode 153 of the transistor 150 are electrically connected through the third connection pad 193 to apply a high potential common voltage.

That is, the stretchable display device according to the embodiment of the present disclosure includes a sheet type upper common electrode layer UCL to drastically reduce the resistance of the upper common electrode layer UCL. Therefore, voltage drop of the high potential common voltage which is applied to the upper common electrode layer UCL due to the resistance may be reduced or minimized. Accordingly, the high potential common voltage which is applied to the upper common electrode layer UCL is uniformly maintained to reduce or minimize the deviation of the high potential common voltage supplied to all pixels PX. By doing this, the luminance of the stretchable display device 100 may be uniformized.

Further, even though it is not illustrated, in some embodiments, openings may be formed in an area of the lower common electrode layer DCL and the upper common electrode layer UCL overlapping with the LED 160 of the light emitting diode. For example, when the LED 160 is a top emission type, the opening may be formed in the overlapping area of the upper common electrode layer UCL and the LED 160 which is disposed in an emission direction. Alternatively, when the LED 160 is a bottom emission type, the opening may be formed in the overlapping area of the lower common electrode layer DCL and the LED 160 which is disposed in an emission direction. Therefore, the openings are formed in the emission direction so that transmittance may be improved, which results in the increase of luminance of the stretchable display device 100.

Referring to FIGS. 1 and 3, the upper substrate US is disposed on the upper common electrode layer UCL. The upper substrate US is a substrate which supports various components disposed below the upper substrate US. Specifically, the upper substrate US may be disposed and contacts the upper common electrode layer UCL by coating a material which configures the upper substrate US on the lower substrate DS and then curing the material.

The upper substrate US which is a flexible substrate may be configured by an insulating material which is bendable or stretchable. The upper substrate US is a flexible substrate so as to be reversibly expanded and contracted. Further, an elastic modulus of the upper substrate may be several MPa to several hundreds of MPa and a ductile breaking ratio may be 100% or higher. A thickness of the upper substrate US may be 10 μm to 1 mm, but is not limited thereto.

The upper substrate US may be formed of the same material as the lower substrate DS. For example, the upper substrate US may be formed of a silicon rubber such as polydimethylsiloxane (PDMS) or an elastomer such as polyurethane (PU) or polytetrafluoroethylene (PTFE) and thus have a flexible property. However, the material of the upper substrate US is not limited thereto.

In the meantime, even though not illustrated in FIGS. 3 and 4, a polarization layer may be disposed on the upper substrate US. The polarization layer may perform a function which polarizes light incident from the outside of the stretchable display device 100 to reduce the external light reflection. Further, an optical film other than the polarization layer may be disposed on the upper substrate US.

Structure of Compensation Circuit

Figure 5:
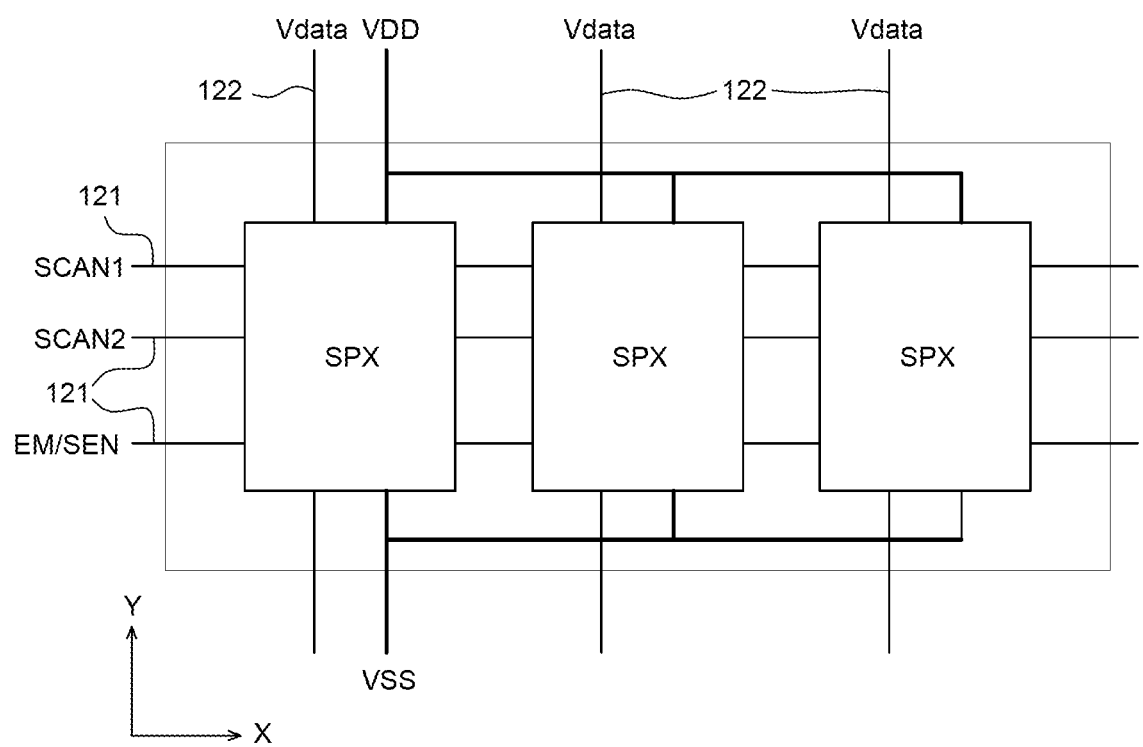
FIG. 5 is a schematic block diagram illustrating a pixel of a stretchable display device according to an embodiment of the present disclosure.

FIG. 5 is a schematic block diagram illustrating a pixel of a stretchable display device according to an embodiment of the present disclosure.

As illustrated in FIG. 5, the plurality of pixels PX includes a plurality of sub pixels SPX. For example, in FIG. 5, three sub pixels SPX which are disposed in parallel in an X-axis direction are illustrated. However, the present disclosure is not limited thereto and the plurality of sub pixels SPX may be disposed in various forms.

Further, a plurality of connection lines 120 may be connected to the plurality of pixels PX. That is, a first connection line 121 which extends in the X-direction and a second connection line 122 which extends in the Y-direction may be connected to the plurality of pixels PX. Even though in FIG. 5, three first connection lines 121 and three second connection lines 122 are illustrated, the present disclosure is not limited thereto and the number of connection lines 120 may be larger or less than three.

Further, three first connection lines 121 may be connected all three sub pixels SPX. Therefore, signals applied to three first connection lines 121 may be independently supplied to all three sub pixels SPX. For example, the plurality of first connection lines 121 may supply a first scan signal SCAN1, a second scan signal SCAN2, and an emission signal EM to each of three sub pixels SPX. Alternatively, some of three first connection lines 121 may be applied with signals from each of the sub pixels SPX. For example, the plurality of first connection lines 121 may supply a first scan signal SCAN1, and a second scan signal SCAN2 to each of three sub pixels SPX or applied with the sensing signal SEN from three sub pixels SPX.

Further, three second connection lines 122 may be connected three sub pixels SPX one by one. That is, one second connection line 122 may be connected only one sub pixel SPX. Therefore, a data signal Vdata applied from one second connection line 122 may be applied only to one sub pixel SPX. For example, when three sub pixels SPX are a red sub pixel SPX, a green sub pixel SPX, an a blue sub pixel SPX, three second connection lines 122 may apply a red data signal Vdata, a green data signal Vdata, and a blue data signal Vdata, respectively.

As described above, the stretchable display device 100 according to the embodiment of the present disclosure does not need to form a separate common line so that the existing common line may be used as a wiring line for compensating for a pixel. Specifically, in the existing stretchable display device, two first connection lines of three first connection lines are used as common lines to apply the low potential common voltage VSS and the high potential common voltage VDD.

However, in the stretchable display device 100 according to the embodiment of the present disclosure, two first connection lines of three first connection lines may be used as wiring lines for circuit compensation. For example, as it will be described below with reference to FIG. 6A, when external compensation is performed, two first connection lines 121 supply the second scan signal SCAN2 and may be applied with a sensing signal SEN. Alternatively, as it will be described below with reference to FIG. 6B, when internal compensation is performed, two first connection lines 121 supply the second scan signal SCAN2 and the emission signal EM, respectively.

Hereinafter, a circuit structure for compensation of the stretchable display device 100 will be described with reference to FIGS. 6A and 6B.

Figure 6A:
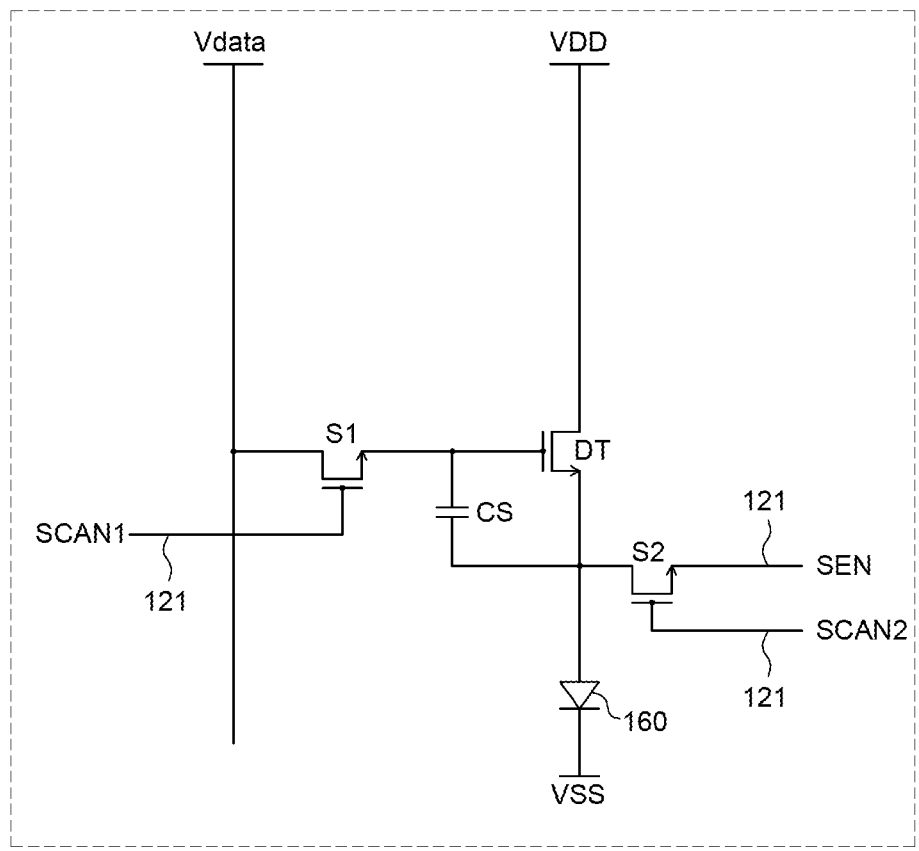
FIG. 6A is a circuit diagram of a sub pixel for external compensation of a stretchable display device according to an embodiment of the present disclosure.

FIG. 6A is a circuit diagram of a sub pixel for external compensation of a stretchable display device according to an embodiment of the present disclosure.

As illustrated in FIG. 6A, each of the sub pixels SPX may include three transistors S1, S2, and DT and one capacitor CS.

The switching transistor S1 is turned on or turned off based on a state of the first scan signal SCAN1. Further, while the first switching transistor S1 is turned on, the data signal Vdata is applied to a gate electrode of the driving transistor DT.

The driving transistor DT controls an emission luminance of the LED 160 depending on a voltage difference between a source electrode and the gate electrode of the driving transistor DT.

The capacitor CS stores a threshold voltage of the driving transistor DT.

Further, the sensing transistor S2 is turned on or turned off based on a state of the second scan signal SCAN2. While the first switching transistor S1 is turned on, the sensing signal SEN is applied from a drain electrode of the driving transistor DT to measure a threshold voltage and a mobility of the driving transistor DT.

Therefore, the data signal Vdata is compensated based on the measured sensing signal SEN to compensate for an image quality of the stretchable display device 100.

As described above, in the stretchable display device 100 according to the embodiment of the present disclosure, two first connection lines 121 do not supply the low potential common voltage VSS and the high potential common voltage VDD, but supply the second scan signal SCAN2, and may be applied with the sensing signal SEN. Therefore, the stretchable display device 100 according to the embodiment of the present disclosure may perform external compensation to improve an image quality of the stretchable display device 100.

Figure 6B:
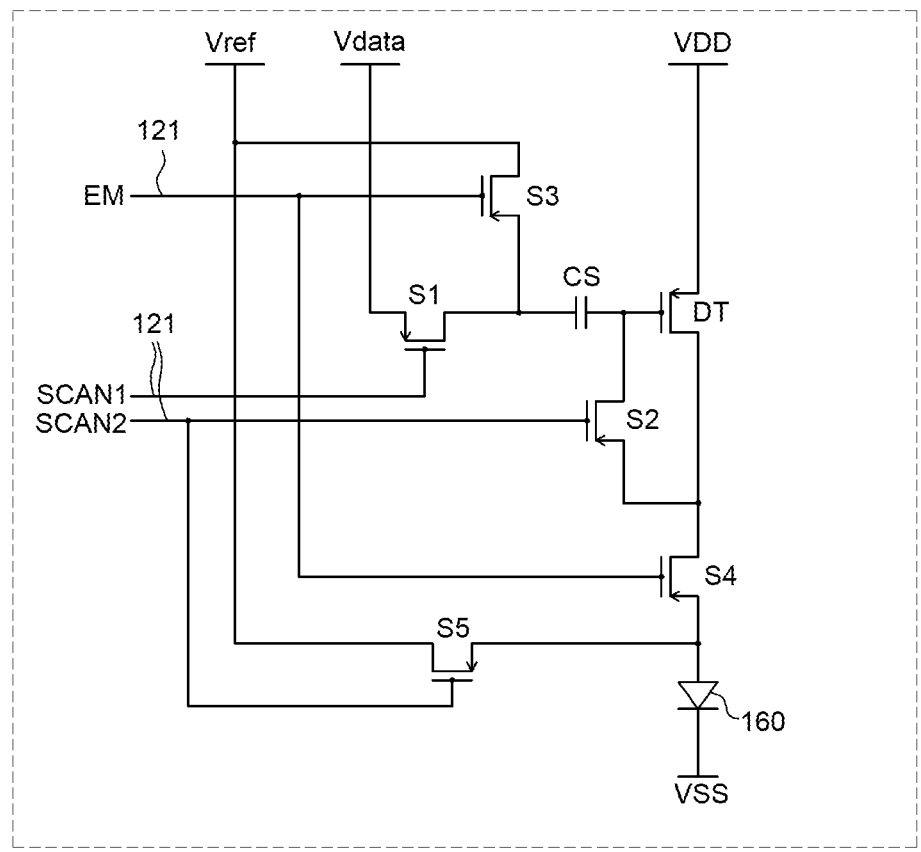
FIG. 6B is a circuit diagram of a sub pixel for internal compensation of a stretchable display device according to an embodiment of the present disclosure.

FIG. 6B is a circuit diagram of a sub pixel for internal compensation of a stretchable display device according to an embodiment of the present disclosure.

As illustrated in FIG. 6B, each of the sub pixels SPX may include six transistors S1, S2, S3, S4, S5, and DT and one capacitor CS.

The first switching transistor S1 is turned on or turned off based on a state of the first scan signal SCAN1. While the first switching transistor S1 is turned on, the data signal Vdata is applied to one electrode of the capacitor CS.

The driving transistor DT controls an emission luminance of the LED 160 depending on a voltage difference between a source electrode and a gate electrode of the driving transistor DT.

The capacitor CS stores a threshold voltage of the driving transistor DT.

The second switching transistor S2 is turned on or turned off based on a state of the second scan signal SCAN2. While the second switching transistor S2 is turned on, a drain electrode and the gate electrode of the driving transistor DT are electrically connected to allow the driving transistor DT to form diode connection. Therefore, the capacitor CS stores a threshold voltage of the driving transistor DT.

The third switching transistor S3 is turned on or turned off based on a state of the emission signal EM. While the third switching transistor S3 is turned on, a reference voltage signal Vref is applied to one electrode of the capacitor CS.

The fourth switching transistor S4 is turned on or turned off based on a state of the emission signal EM. While the fourth switching transistor S4 is turned on, a driving voltage is applied to the LED 160.

The fifth switching transistor S5 is turned on or turned off based on a state of the second scan signal SCAN2. While the fifth switching transistor S5 is turned on, one electrode of the LED 160 is initialized with the reference signal.

As described above, the second switching transistor S2 allows the driving transistor DT to form a diode connection to store the threshold voltage in the capacitor CS and perform the internal compensation. Therefore, an image quality of the stretchable display device 100 may be compensated.

As described above, in the stretchable display device 100 according to the embodiment of the present disclosure, two first connection lines 121 do not supply the low potential common voltage VSS and the high potential common voltage VDD, but the first connection lines 121 may supply the second scan signal SCAN2 and the emission signal EM. Accordingly, the stretchable display device 100 according to the embodiment of the present disclosure performs the internal compensation to improve the image quality.

Hereinafter, a stretchable display device according to another embodiment of the present disclosure will be described in detail. The stretchable display device according to another embodiment of the present disclosure is the same as the stretchable display device according to the embodiment of the present disclosure except that a plurality of touch lines is added. Hereinafter, the plurality of touch lines will be described in more detail.

Another Embodiment—Touch Line

Figure 7:
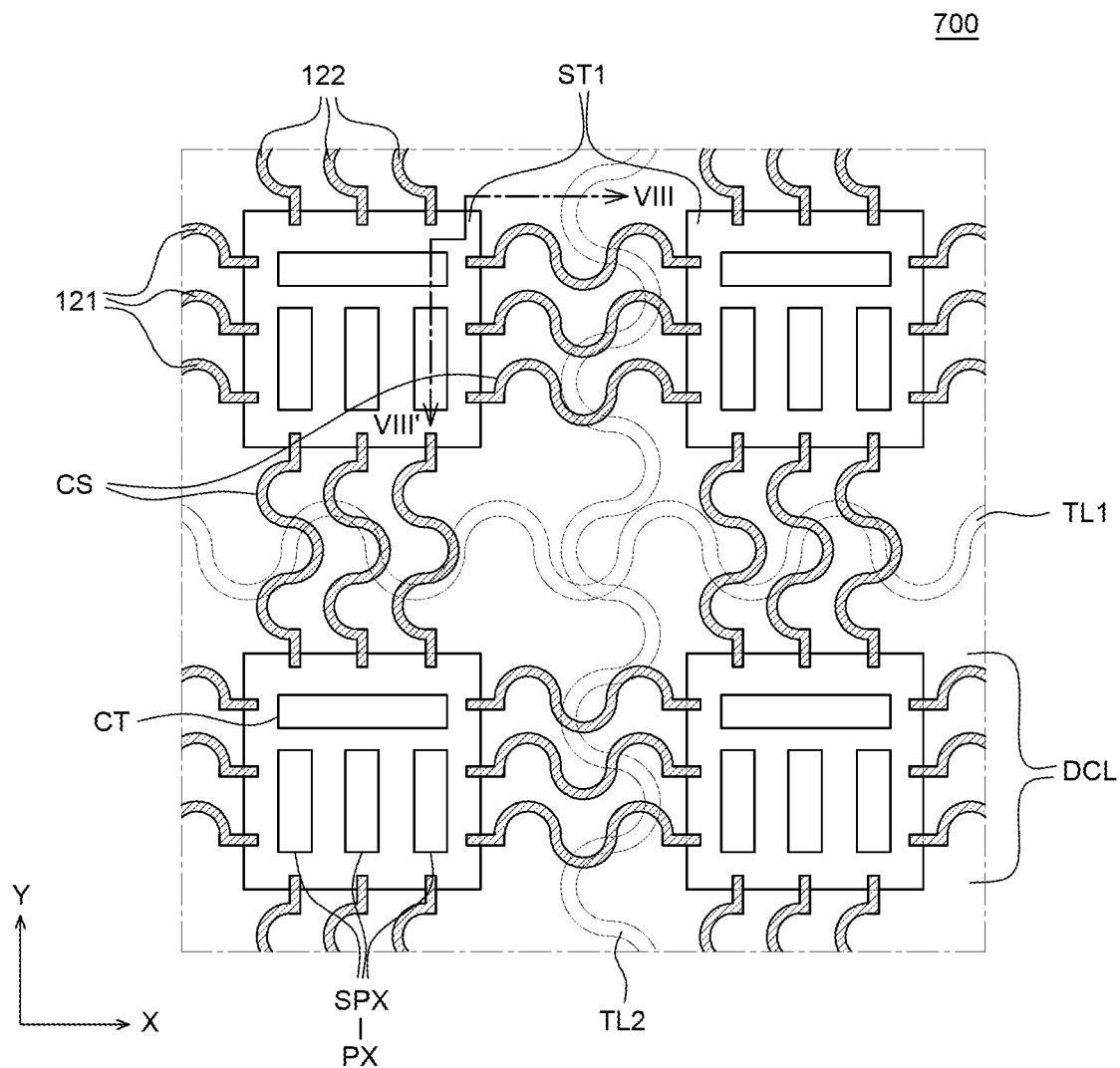
FIG. 7 is an enlarged plan view of a stretchable display device according to another embodiment of the present disclosure.
Figure 8:
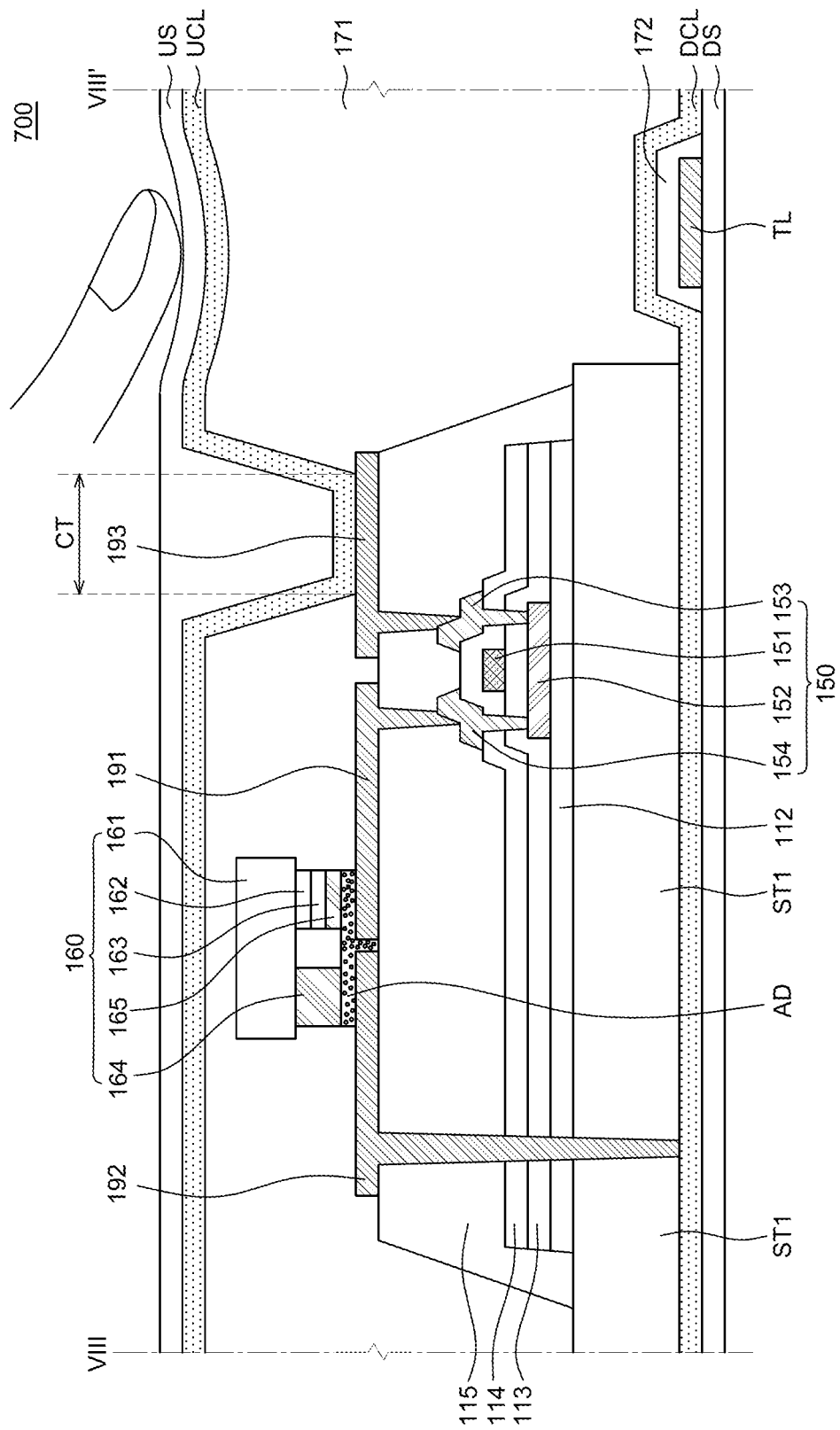
FIG. 8 is a cross-sectional view of a stretchable display device according to another embodiment of the present disclosure.

FIG. 7 is an enlarged plan view of a stretchable display device according to another embodiment of the present disclosure. FIG. 8 is a cross-sectional view of a stretchable display device according to another embodiment of the present disclosure.

As illustrated in FIGS. 7 and 8, a stretchable display device 700 according to another embodiment of the present disclosure may further include a plurality of touch lines TL disposed on a top surface of the stretchable display device 700 to sense a touch.

The plurality of touch lines TL includes a first touch line TL1 and a second touch line TL2. The first touch line TL1 and the second touch line TL2 may extend between the plurality of first substrates ST1. Further, the first touch line TL1 and the second touch line TL2 may be formed to partially overlap with the first connection line 121 and the second connection line 122.

In FIG. 7, the first touch line TL1 may refer to a wiring line extending in an X-axis direction among the plurality of touch lines TL and the second touch line TL2 may refer to a wiring line extending in a Y-axis direction among the plurality of touch lines TL. Further, the first touch line TL1 may be disposed to be parallel to the first connection line 121 and the second touch line TL2 may be disposed to be parallel to the second connection line 122. Therefore, since the first touch line TL1 extends in the X-axis direction to just partially overlap with the second connection line 122 which extends in the Y-axis direction, but does not overlap with the first connection line 121 which extends in the X-axis direction. Further, since the second touch line TL2 extends in the Y-axis direction to just partially overlap with the first connection line 121 which extends in the X-axis direction, but does not overlap with the second connection line 122 which extends in the Y-axis direction.

Further, a signal transmitted by the first touch line TL1 may be different from a signal transmitted by the second touch line TL2. For example, the first touch line TL1 may serve as a transmitter Tx and the second touch line TL2 serves as a receiver Rx. Therefore, a touch driving signal may be applied to the first touch line TL1 and a touch sensing signal may be received by the second touch line TL2.

The plurality of touch lines TL may be formed of a metal material such as copper (Cu), aluminum (Al), titanium (Ti), and molybdenum (Mo) or a stacked structure of metal materials such as copper/molybdenum-titanium (Cu/Moti) or titanium/aluminum/titanium (Ti/Al/Ti), but is not limited thereto.

In order to extend the plurality of touch lines TL, the touch lines TL have a curved shape in plain view. For example, as illustrated in FIG. 7, the plurality of touch lines TL may have a sine wave shape. However, the shape of the plurality of touch lines TL is not limited thereto and for example, the plurality of touch lines TL may extend with a zigzag pattern or may be formed with various shapes such as a shape extended by connecting a plurality of rhombus-shaped substrates at vertexes. Further, the number and the shape of the plurality of touch lines TL illustrated in FIG. 7 are illustrative and the number and the shape of the plurality of touch lines TL may vary depending on the design.

As illustrated in FIG. 8, the plurality of touch lines TL may be disposed between the lower common electrode layer DCL and the lower substrate DS. However, the plurality of touch lines TL transmits the touch driving signal and the touch sensing signal so that the plurality of touch lines TL should not be in contact with the lower common electrode layer DCL. To this end, the touch lines TL disposed on the lower common electrode layer DCL may be covered or at least partially covered by a touch insulating layer 172. The touch insulating layer 172 is a layer which electrically insulates the touch line TL and may be formed of an insulating material. For example, the touch insulating layer 172 may be formed as a single layer of silicon nitride (SiNx) or silicon oxide (SiOx) which is an inorganic material or a multi-layer of silicon nitride (SiNx) or silicon oxide (SiOx), but it is not limited thereto.

A touch sensing operation of the stretchable display device 700 according to another embodiment of the present disclosure will be described as follows: A user may touch a top surface of the stretchable display device 700. As described above, the upper substrate US and the upper common electrode layer UCL are stretchable so that the upper common electrode layer UCL may partially downwardly extend by the touch. By doing this, the plurality of touch lines TL is close to the upper common electrode layer UCL so that a capacitance between the plurality of touch lines TL and the upper common electrode layer UCL is changed. The plurality of touch lines TL receives a touch sensing signal to which the change of the capacitance is reflected, which is described above, to determine whether an upper portion of the stretchable display device 700 is touched.

That is, according to another embodiment of the present disclosure, the plurality of touch lines TL is additionally disposed below the upper common electrode layer UCL to supply a uniform common voltage, implement a compensation circuit, and provide a touch function in the stretchable display device 700 to be applied for various purposes. That is, the stretchable display device 700 according to another embodiment of the present disclosure may also include a touch interface.

The embodiments of the present disclosure can also be described as follows:

According to an aspect of the present disclosure, a stretchable display device includes a lower substrate which is stretchable; a lower common electrode layer disposed on the lower substrate; a plurality of first substrates disposed on the lower common electrode layer; at least one transistor formed on each of the plurality of first substrates; a light emitting diode which is electrically connected to the at least one transistor; a cover insulating layer which covers at least one light emitting diode; and an upper common electrode layer formed on the cover insulating layer, thereby stably supplying a common voltage.

The lower common electrode layer may be disposed on an entire surface of the lower substrate.

The upper common electrode layer may be disposed on an entire surface of the cover insulating layer.

The lower common electrode layer may be electrically connected to the light emitting diode and the upper common electrode layer may be electrically connected to the at least one transistor.

The stretchable display device may further comprise a planarization layer which is disposed on the at least one transistor, a second connection pad which extends through the planarization layer, and directly or indirectly contacts the lower common electrode layer and the light emitting diode and a third connection pad which extends through the planarization layer, and directly or indirectly contacts the upper common electrode layer and the at least one transistor.

A low potential common voltage is applied to the lower common electrode layer and a high potential common voltage is applied to the upper common electrode layer.

The upper common electrode layer and the lower common electrode layer may be configured by a stretchable conductive material.

In some embodiments, the stretchable conductive material may be configured by any one of PEDOT:PSS, silver nano wires (AgNWs), and graphene.

An elastic modulus of the lower common electrode layer is equal or substantially equal to an elastic modulus of the lower substrate.

The stretchable display device may further comprise a stretchable upper substrate which is opposite to the lower substrate.

An elastic modulus of the upper common electrode layer may be equal or substantially equal to an elastic modulus of the upper substrate.

An opening may be formed in an area of the upper common electrode layer and the lower common electrode layer which overlap with the light emitting diode.

The stretchable display device may further comprise a plurality of connection lines which is connected to the at least one transistor.

The cover insulating layer may include a first insulating pattern disposed above the light emitting diode and a second insulating pattern which is disposed above the plurality of connection lines.

Some of the plurality of connection lines may supply a plurality of scan signals.

Some of the plurality of connection lines may be applied with a sensing signal of the at least one transistor.

Some of the plurality of connection lines may supply an emission signal.

The stretchable display device may further comprise a plurality of touch lines which is disposed between the lower common electrode layer and the lower substrate to sense a touch of a user.

The plurality of touch lines may have a curved shape.

The stretchable display device may further comprise a touch insulating layer which covers and encloses the plurality of touch lines.

According to another aspect of the present disclosure, a stretchable display device includes a lower common electrode layer which is stretchable; a plurality of pixels disposed on the lower common electrode layer; a cover insulating layer which covers the plurality of pixels; and an upper common electrode layer which is formed on the cover insulating layer and is stretchable, in which the lower common electrode layer and the upper common electrode layer are electrically connected to the plurality of pixels.

Each of the plurality of pixels may include at least one transistor and a light emitting diode, the lower common electrode layer is electrically connected to the at least one transistor, and the upper common electrode layer is electrically connected to the light emitting diode.

Although the embodiments of the present disclosure have been described in detail with reference to the accompanying drawings, the present disclosure is not limited thereto and may be embodied in many different forms without departing from the technical concept of the present disclosure. Therefore, the embodiments of the present disclosure are provided for illustrative purposes only but not intended to limit the technical concept of the present disclosure. The scope of the technical concept of the present disclosure is not limited thereto. Therefore, it should be understood that the above-described embodiments are illustrative in all aspects and do not limit the present disclosure. The protective scope of the present disclosure should be construed based on the following claims, and all the technical concepts in the equivalent scope thereof should be construed as falling within the scope of the present disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A stretchable display device, comprising:
   a lower substrate which is stretchable;
   a lower common electrode layer disposed on the lower substrate;
   a plurality of first substrates disposed on the lower common electrode layer;
   at least one transistor on each of the plurality of first substrates;
   a light emitting diode which is electrically connected to the at least one transistor;
   a cover insulating layer which at least partially covers the at least one light emitting diode; and
   an upper common electrode layer on the cover insulating layer.

2. The stretchable display device according to claim 1, wherein the lower common electrode layer is disposed on an entire surface of the lower substrate.

3. The stretchable display device according to claim 1, wherein the upper common electrode layer is disposed on an entire surface of the cover insulating layer.

4. The stretchable display device according to claim 1, wherein the lower common electrode layer is electrically connected to the light emitting diode and the upper common electrode layer is electrically connected to the at least one transistor.

5. The stretchable display device according to claim 1, further comprising:
   a planarization layer which is disposed on the at least one transistor;
   a second connection pad which extends through the planarization layer and contacts the lower common electrode layer and the light emitting diode; and
   a third connection pad which extends through the planarization layer and contacts the upper common electrode layer and the at least one transistor.

6. The stretchable display device according to claim 1, wherein a low potential common voltage is applied to the lower common electrode layer and a high potential common voltage is applied to the upper common electrode layer.

7. The stretchable display device according to claim 1, wherein the upper common electrode layer and the lower common electrode layer includes a stretchable conductive material.

8. The stretchable display device according to claim 7, wherein the stretchable conductive material includes at least one of PEDOT:PSS, silver nano wires (AgNWs), or graphene.

9. The stretchable display device according to claim 1, wherein an elastic modulus of the lower common electrode layer is equal or substantially equal to an elastic modulus of the lower substrate.

10. The stretchable display device according to claim 1, further comprising:
    a stretchable upper substrate which is opposite to the lower substrate,
    wherein an elastic modulus of the upper common electrode layer is equal or substantially equal to an elastic modulus of the upper substrate.

11. The stretchable display device according to claim 1, further comprising:
    an opening formed in an area of the upper common electrode layer and the lower common electrode layer which overlaps with the light emitting diode.

12. The stretchable display device according to claim 1, further comprising:
    a plurality of connection lines which is connected to the at least one transistor.

13. The stretchable display device according to claim 12, wherein the cover insulating layer includes:
    a first insulating pattern disposed above the light emitting diode; and
    a second insulating pattern which is disposed above the plurality of connection lines.

14. The stretchable display device according to claim 12, wherein some of the plurality of connection lines supplies a plurality of scan signals.

15. The stretchable display device according to claim 12, wherein some of the plurality of connection lines is applied with a sensing signal of the at least one transistor.

16. The stretchable display device according to claim 12, wherein some of the plurality of connection lines supplies an emission signal.

17. The stretchable display device according to claim 1, further comprising:
    a plurality of touch lines which is disposed between the lower common electrode layer and the lower substrate to sense a touch of a user.

18. The stretchable display device according to claim 17, wherein the plurality of touch lines has a curved shape.

19. The stretchable display device according to claim 17, further comprising:
    a touch insulating layer which at least partially covers and encloses the plurality of touch lines.

20. The stretchable display device according to claim 17, wherein each of the plurality of pixels includes at least one transistor and a light emitting diode,
    wherein the lower common electrode layer is electrically connected to the at least one transistor, and the upper common electrode layer is electrically connected to the light emitting diode.

21. A stretchable display device, comprising:
    a lower common electrode layer which is stretchable;
    a plurality of pixels disposed on the lower common electrode layer;
    a cover insulating layer on the plurality of pixels; and
    an upper common electrode layer which is formed on the cover insulating layer and is stretchable,
    wherein the lower common electrode layer and the upper common electrode layer are electrically connected to the plurality of pixels.

* * * * *